(12) United States Patent
Skepnek et al.

(10) Patent No.: US 9,972,930 B1
(45) Date of Patent: May 15, 2018

(54) TRANSCEIVER MODULE WIT FLEX CIRCUIT

(71) Applicant: Methode Electronics, Inc., Chicago, IL (US)

(72) Inventors: Robert Skepnek, Chicago, IL (US); Joseph Llorens, Winfield, IL (US); Alexandros Pirillis, Skokie, IL (US)

(73) Assignee: Methode Electronics, Inc., Chicago, IL (US)

( * ) Notice: Subject to any disclaimer, the term of this patent is extended or adjusted under 35 U.S.C. 154(b) by 22 days.

(21) Appl. No.: 15/406,920

(22) Filed: Jan. 16, 2017

(51) Int. Cl.
*H01R 12/81* (2011.01)
*H01R 12/77* (2011.01)
*H01R 12/82* (2011.01)

(52) U.S. Cl.
CPC .......... *H01R 12/81* (2013.01); *H01R 12/772* (2013.01); *H01R 12/82* (2013.01)

(58) Field of Classification Search
CPC ....... H01R 12/81; H01R 12/772; H01R 12/82
USPC ............................................................ 439/1
See application file for complete search history.

(56) References Cited

U.S. PATENT DOCUMENTS

| | | | |
|---|---|---|---|
| 4,226,491 A | 10/1980 | Kazama | |
| 4,664,459 A * | 5/1987 | Flanagan | H01R 13/523 174/117 FF |
| 4,894,015 A * | 1/1990 | Stockero | H01R 12/724 29/842 |
| 4,975,068 A * | 12/1990 | Squires | H01R 12/78 439/372 |
| 5,173,058 A * | 12/1992 | Broeksteeg | H01R 13/193 439/267 |
| 5,507,654 A | 4/1996 | Daly | |
| 5,636,998 A | 6/1997 | Daly | |
| 5,748,924 A * | 5/1998 | Llorens | G06F 13/4045 341/100 |
| 5,951,322 A * | 9/1999 | Nishikigi | B60R 16/027 439/456 |
| 5,954,536 A * | 9/1999 | Fuerst | H01R 12/79 439/493 |
| 5,977,489 A * | 11/1999 | Crotzer | B32B 27/08 174/257 |
| 6,017,222 A * | 1/2000 | Kao | H01R 12/613 439/493 |
| 6,072,803 A * | 6/2000 | Allmond | H04L 12/44 370/445 |
| 6,179,627 B1 | 1/2001 | Daly | |
| 6,280,241 B2 * | 8/2001 | Herlinger | H01R 12/592 439/496 |
| 6,304,436 B1 * | 10/2001 | Branch | G02B 6/4277 361/679.02 |
| 6,315,207 B1 | 11/2001 | Eisele | |

(Continued)

*Primary Examiner* — Alexander Gilman
(74) *Attorney, Agent, or Firm* — Methode Electronic, Inc.

(57) ABSTRACT

A transceiver assembly is provided that includes a transceiver housing having first end, having a connector and an opposite second end having a passage in communication with a printed circuit board mounted in the housing. A peripheral connector having a first end and opposite second end includes a receptacle opening at the second end. A flex circuit is disposed between the first end of the peripheral connector and the second end of the transceiver housing. The peripheral connector is capable of being displaced with respect to the transceiver housing via the flex circuit.

17 Claims, 9 Drawing Sheets

(56) References Cited

U.S. PATENT DOCUMENTS

| | | | |
|---|---|---|---|
| 6,417,885 B1* | 7/2002 | Suzuki | H04N 5/2251 348/374 |
| 6,517,361 B1* | 2/2003 | Yatskov | H01R 13/6315 174/117 F |
| 6,533,588 B1* | 3/2003 | Woith | H01R 13/24 439/289 |
| 6,713,510 B2 | 5/2004 | Hwang | |
| 6,769,920 B1* | 8/2004 | Mease | G06F 1/18 439/493 |
| 6,797,891 B1* | 9/2004 | Blair | H05K 1/147 174/110 R |
| 6,876,838 B1* | 4/2005 | Daly | H01R 31/06 379/428.01 |
| 6,930,240 B1* | 8/2005 | Giboney | H01R 13/65802 174/36 |
| 7,086,884 B2* | 8/2006 | Okano | H01R 12/774 439/260 |
| 7,144,256 B2* | 12/2006 | Pabst | H01R 12/88 439/67 |
| 7,215,889 B2 | 5/2007 | Light | |
| 7,241,173 B2* | 7/2007 | Callahan | H01R 12/592 439/579 |
| 7,331,824 B2* | 2/2008 | Lin | H01R 31/06 439/470 |
| 7,371,093 B1* | 5/2008 | Johnson | H01R 12/88 439/260 |
| 7,387,538 B2* | 6/2008 | Engel | H01R 13/6658 439/620.23 |
| 7,410,387 B2* | 8/2008 | Howard | H01B 7/40 439/449 |
| 7,425,134 B1* | 9/2008 | Taylor | H01R 12/62 439/66 |
| 7,425,135 B2* | 9/2008 | Liu | H01R 23/661 439/329 |
| 7,439,449 B1* | 10/2008 | Kumar | G02B 6/4292 174/254 |
| 7,513,698 B2 | 4/2009 | Andersson | |
| 7,555,572 B2 | 6/2009 | Fischer | |
| 7,586,173 B2* | 9/2009 | Curry | G01N 27/301 257/476 |
| 7,614,913 B2 | 11/2009 | Ice | |
| 7,616,452 B2* | 11/2009 | Wehrly, Jr. | H05K 1/189 174/254 |
| 7,724,530 B2* | 5/2010 | Clayton | H05K 1/189 174/254 |
| 7,824,113 B2 | 11/2010 | Wong | |
| 7,869,181 B2* | 1/2011 | Le | B64D 45/02 361/212 |
| 8,003,887 B1* | 8/2011 | Hsieh | H02G 11/006 174/69 |
| 8,247,699 B2* | 8/2012 | Shen | H05K 1/028 174/254 |
| 8,419,444 B2* | 4/2013 | Kagan | H01R 31/065 439/76.1 |
| 8,579,637 B2* | 11/2013 | Liskow | H01R 12/778 439/67 |
| 8,851,356 B1* | 10/2014 | Holec | H01R 4/02 228/103 |
| 8,961,220 B2* | 2/2015 | Hilbourne | H01R 13/516 439/502 |
| 9,048,573 B2 | 6/2015 | Grzegorzewska | |
| 9,113,551 B2* | 8/2015 | McClatchie | H05K 1/147 |
| 9,350,094 B2* | 5/2016 | Lhommeau | H01R 12/592 |
| 2003/0231475 A1* | 12/2003 | Kappel | H01R 12/79 361/796 |
| 2004/0092135 A1* | 5/2004 | Hofmeister | H01R 11/30 439/39 |
| 2006/0025018 A1 | 2/2006 | Dube | |
| 2007/0218712 A1* | 9/2007 | Guja | G02B 6/4201 439/67 |
| 2008/0084834 A1* | 4/2008 | Stanek | G06F 13/385 370/284 |
| 2013/0004131 A1* | 1/2013 | Skepnek | G02B 6/4201 385/92 |
| 2014/0065851 A1* | 3/2014 | Gilbert | H05K 3/361 439/67 |

\* cited by examiner

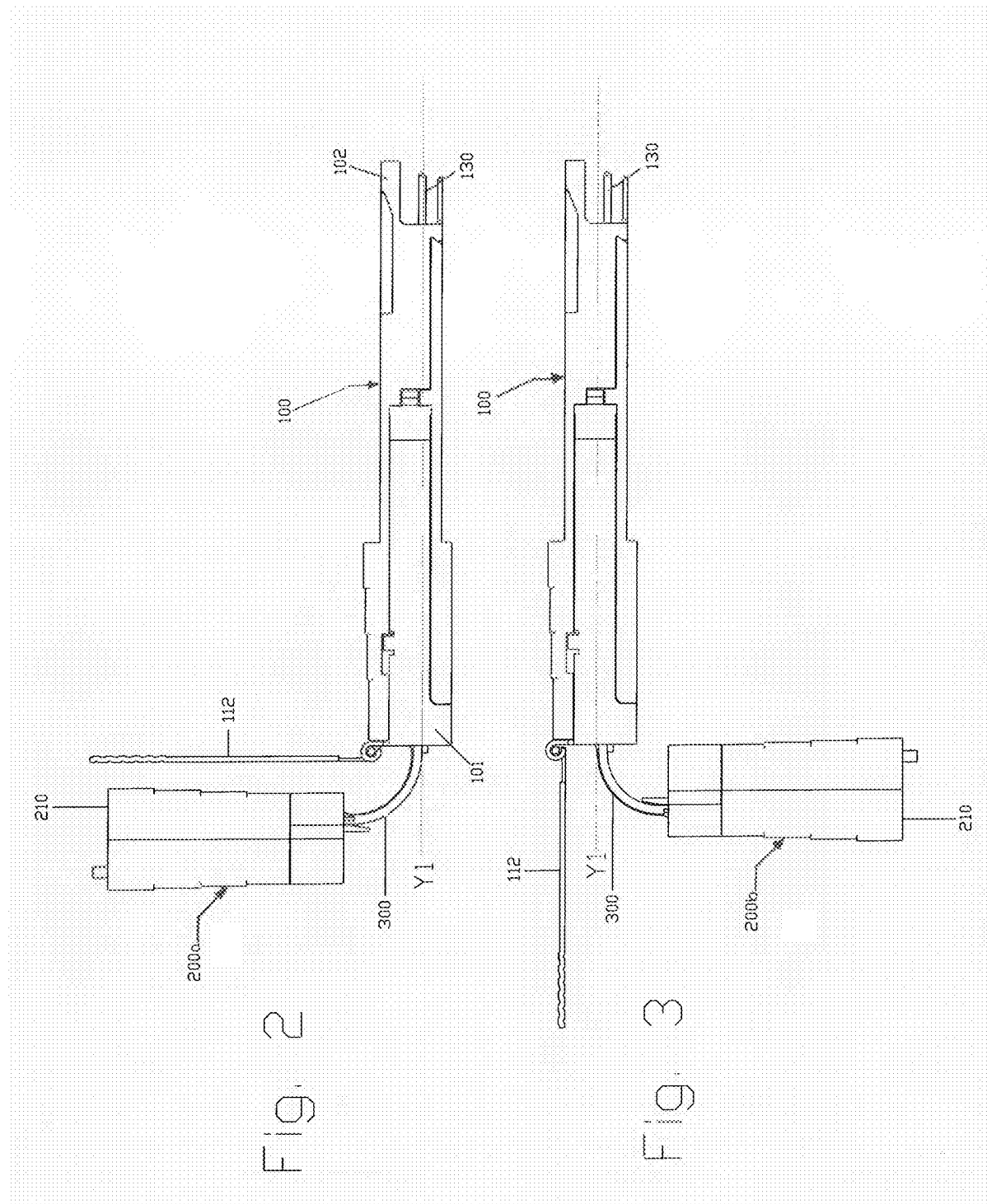

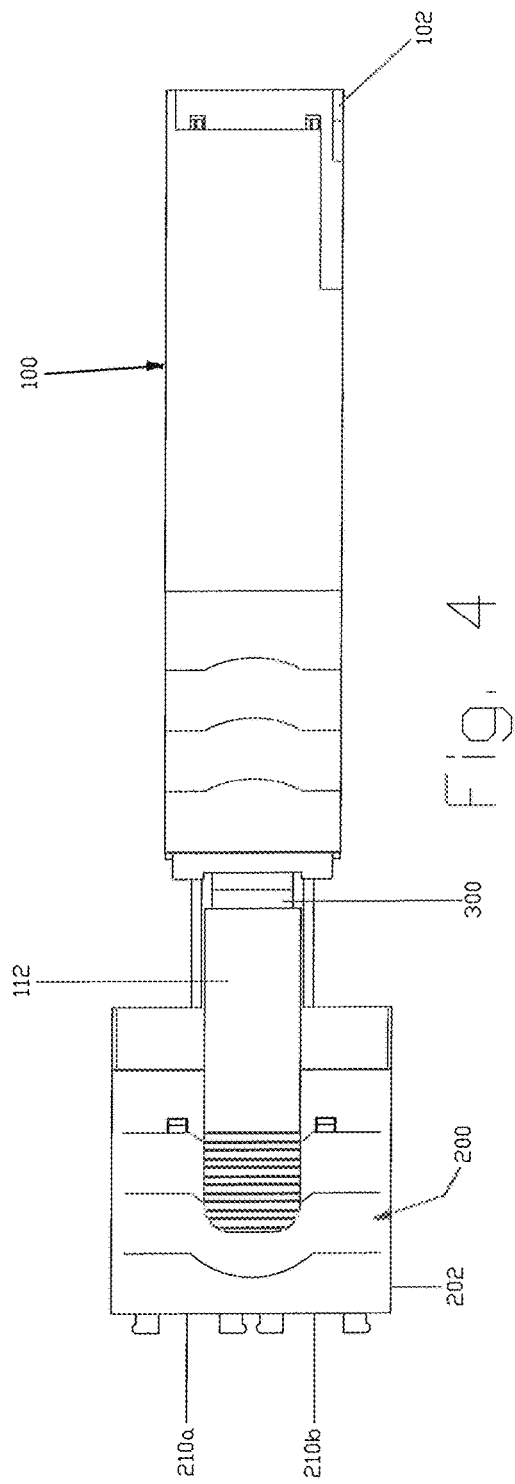
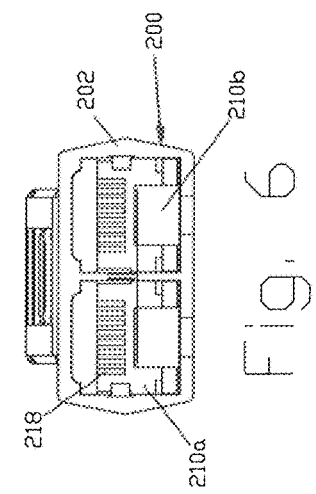
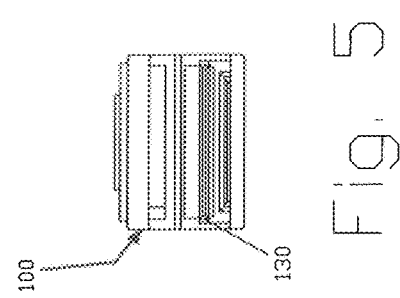

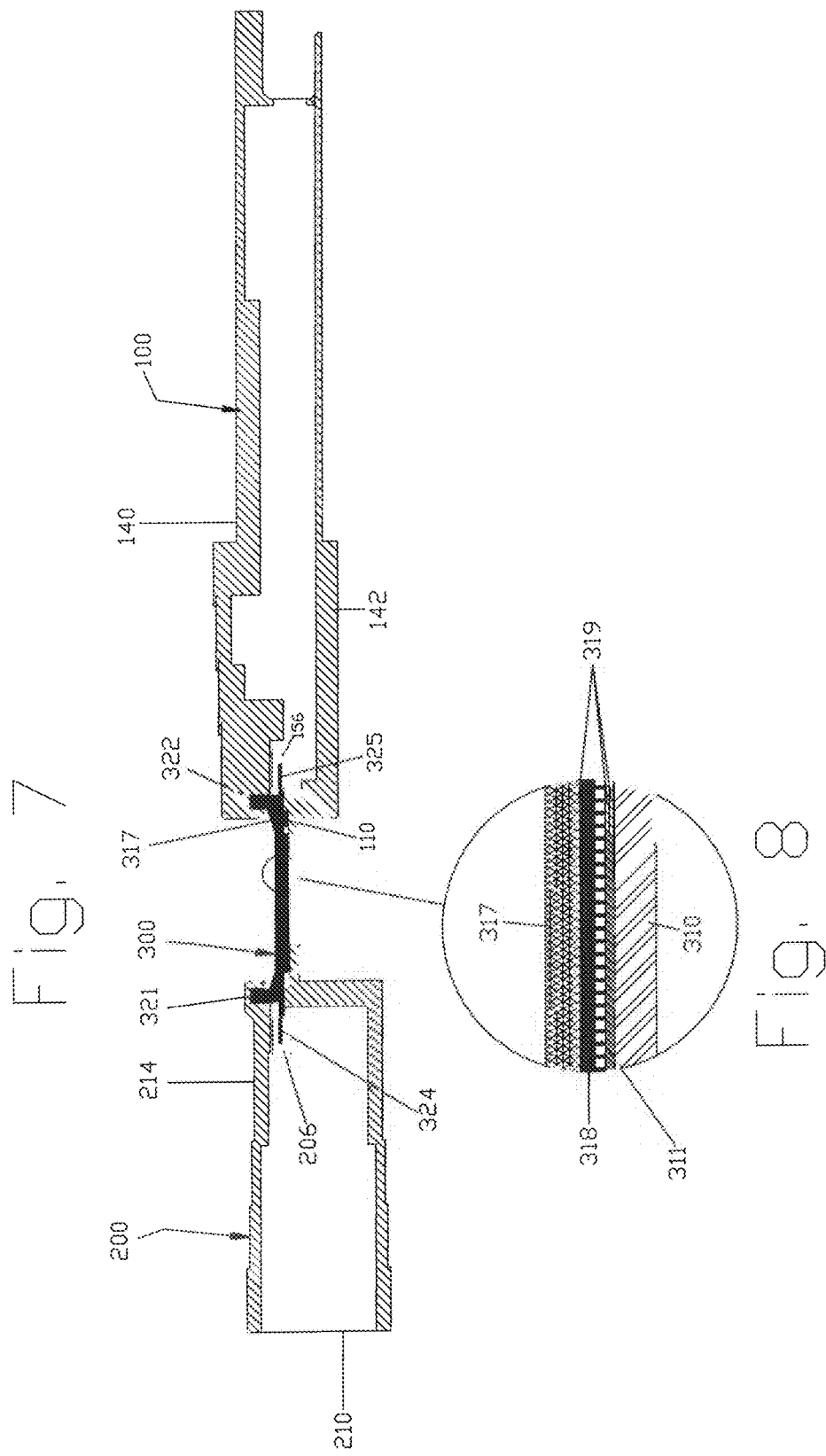

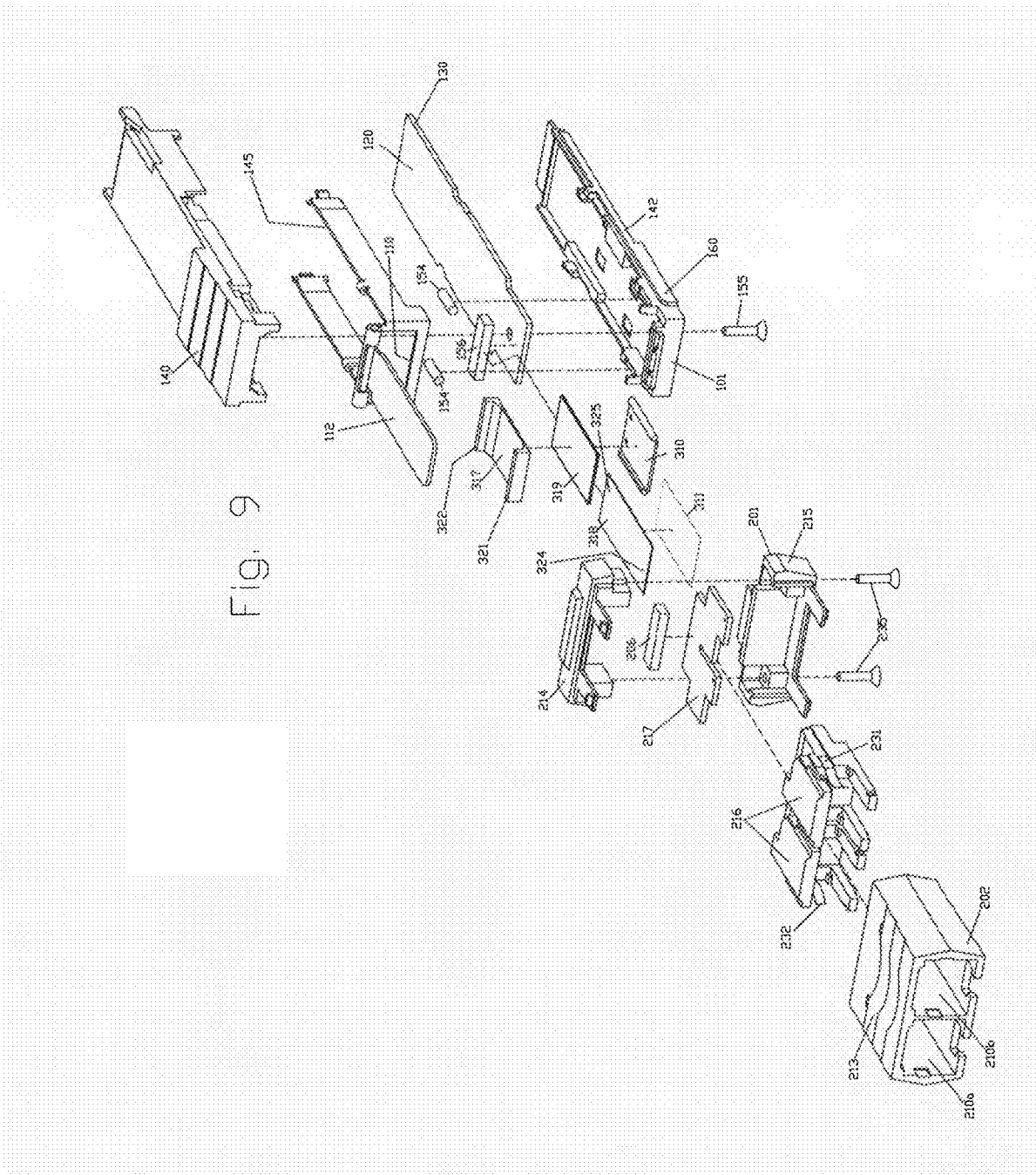

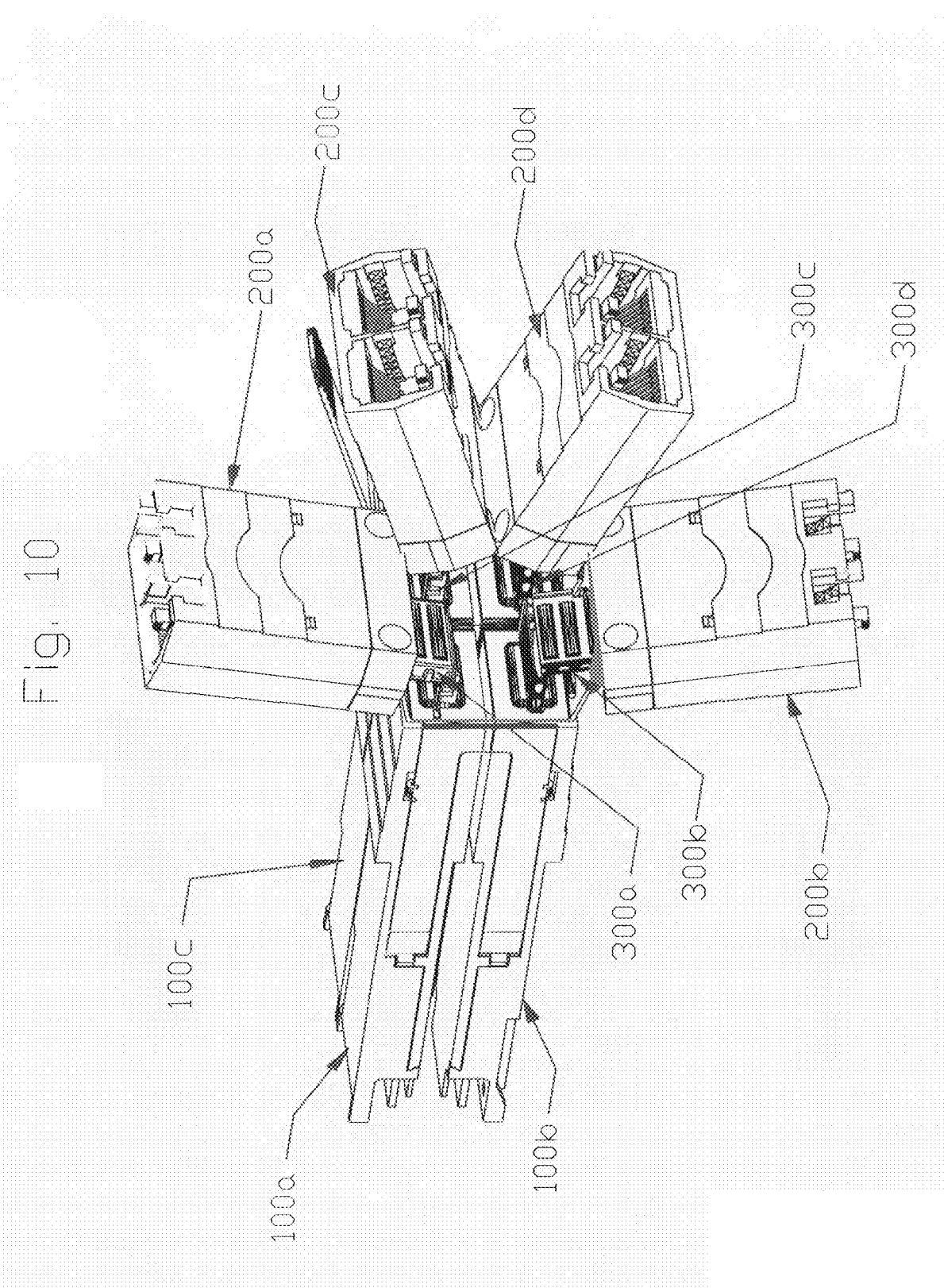

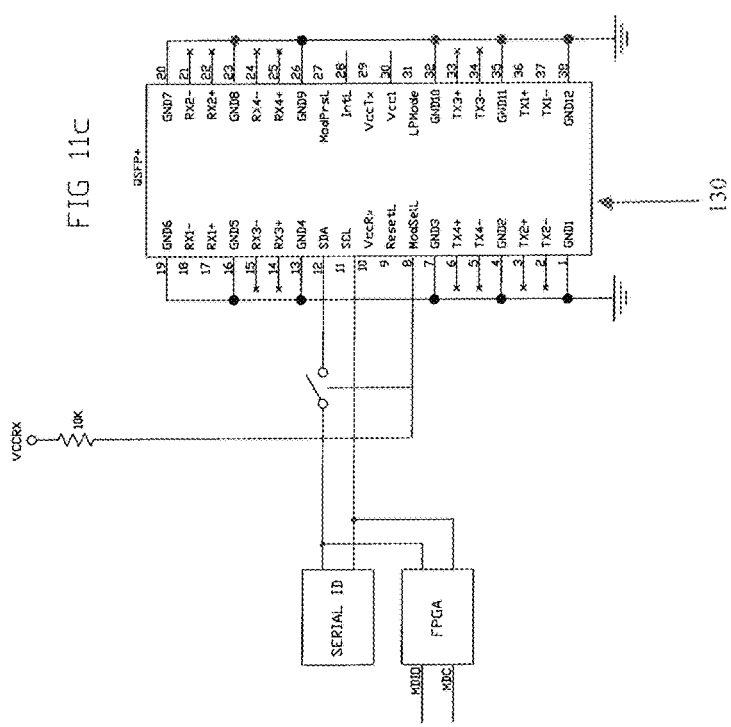

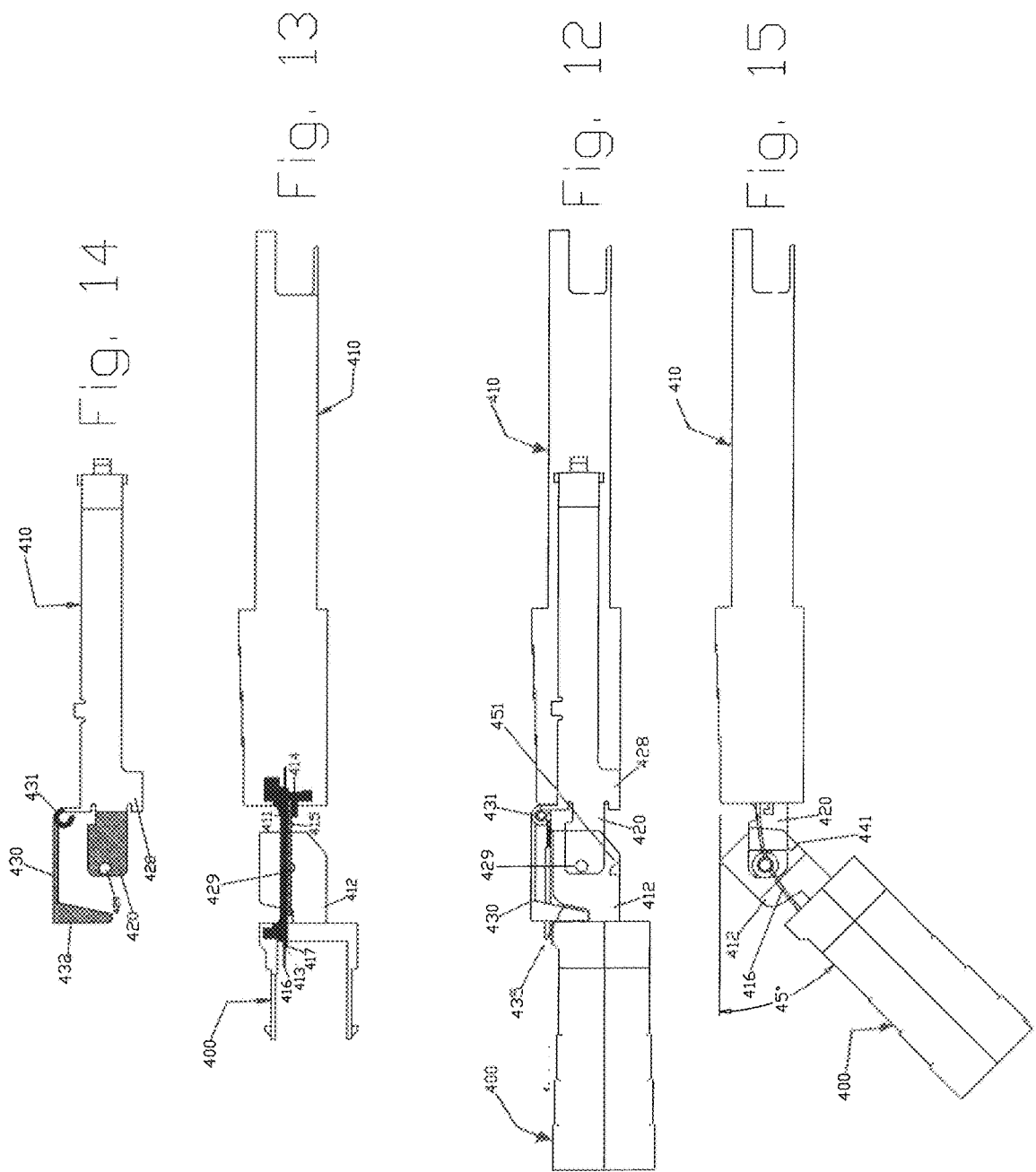

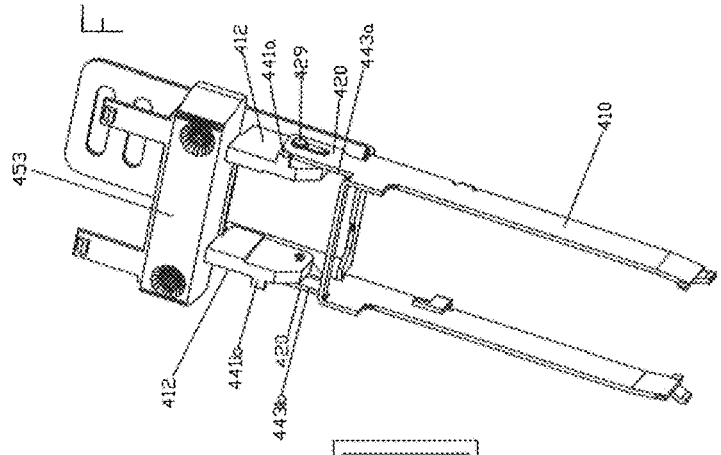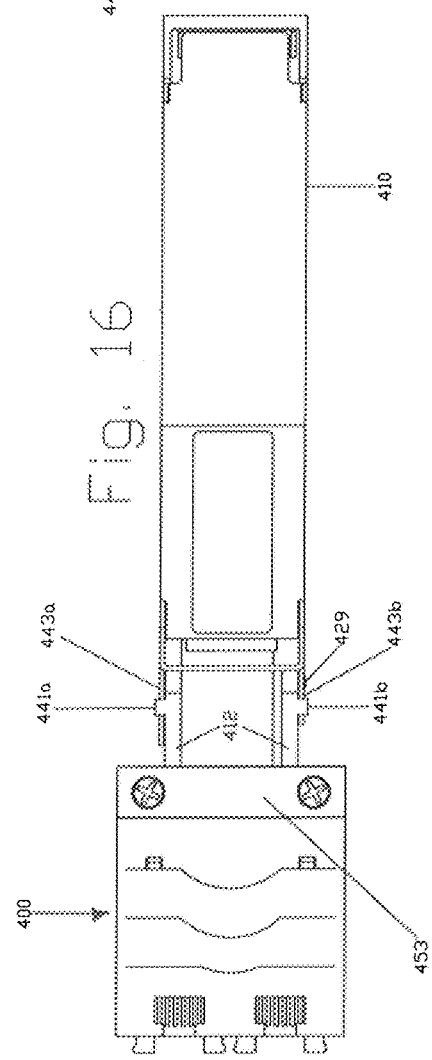

TRANSCEIVER MODULE WIT FLEX CIRCUIT

The present invention relates to a transceiver module assembly for providing high speed data transfer and including a transceiver module having a flex circuit and peripheral connector.

BACKGROUND

Copper transceiver modules are well known for high performance integrated duplex data links for bi-directional communication over copper or fiber cables. Such modules provide high speed communication links providing up to 10 Gigabit Ethernet transmissions over Cat 6a/7 cables. Devices are known such as Quad Small Form-factor Pluggable (QSFP) transceiver modules that provide hot pluggable modules that integrate four transmit and four receive channels with a standard Multi-fiber Push On (MPO) fiber-optic connector for high density applications. Such QSFP modules may also provide for copper transmission. As well, a QSFP enhanced transceiver, such as a QSFP+ module enables data communications at data rates of up to 40 Gigabits per second (40 G). Four 10 G data paths transmit and receive across the QSFP+ to provide 40 G data transmit and receive channels. Such transceiver modules are also known to include copper 10G-Base-T ports that have Registered Jack (RJ) 45 connectors (as defined by the Institute of Electrical and Electronic) (IEEE Standard 802.3an-2006). Such RJ-45 connectors, however, are difficult to use in densely populated racks of equipment in data centers. The present invention overcomes those disadvantages.

SUMMARY

The present invention provides a transceiver assembly comprising a transceiver housing having a first end, having a connector and an opposite second end having a passage in communication with a printed circuit board mounted in the housing. A peripheral connector is provided having a first end and an opposite second end, the second end having a receptacle opening. A flex circuit is disposed between the first end of the peripheral connector and the second end of the transceiver housing, the peripheral connector being capable of being displaced with respect to the transceiver housing via the flex circuit.

In an embodiment the transceiver housing may have a center-line extending between the first and second end of the flex circuit allowing for displacement of the flex circuit with respect to the center-line. In an embodiment, the peripheral connector is displaced laterally with respect to the center-line upon flexing of the flex circuit and the flex circuit is attached to the transceiver housing in a plane disposed from the center-line.

In an embodiment the flex circuit includes circuit traces for carrying electrical signals between the transceiver housing and the peripheral connector. In an embodiment the flex circuit includes a spacer, foil wrap and strain relief. In an embodiment a zero insertion force (ZIF) connector is disposed in the housing and receives an end of the flex circuit. In an embodiment, the zero insertion force (ZIF) connector is disposed in the peripheral connector and receives an end of the flex circuit. In an embodiment the flex circuit may allow for lateral movement but prevent side to side movement and the center line defines a Z axis plane.

In an embodiment a pivot arm extending from the transceiver housing and a pivot extension protruding from the peripheral connector are provided and the pivot arm and pivot extension may be pivotally attached and restrict movement of the flex circuit in the Y-axis plane. In an embodiment an anti-deflection member is provided to limit the angle of deflection of the flex circuit. In an embodiment the anti-deflection member includes a flap pivotally attached to the transceiver housing.

In an embodiment the flap may have a pivot point on the transceiver housing and a leg opposite the pivot point and the leg received in a gap of the pivot extension. In an embodiment a deflection control member may be disposed on the pivot arm in order to control the angle of deflection of the flex circuit and peripheral connector.

In an embodiment the flex circuit may include an X-axis that is perpendicular to the Z-axis and a Y-axis that is perpendicular to the X-axis. The Y axis and Z axis form a YZ plane and the flex circuit restricts movement of the peripheral connector and along the X-axis and Y-axis but allow movement within the ZY plane. In an embodiment the flex circuit has a planar construction that prevents movement in the Y-axis and X-axis.

The present invention provides a flex circuit comprising a spacer, foil wrap and a strain relief. The invention includes the flex circuit that allows for lateral movement but prevents side to side movement and the flex circuit having a center line that defines a Y-axis, the flex circuit including an X-axis that is perpendicular to the Z-axis and the Y-axis that is perpendicular to an X-axis and the flex circuit provides for movement in the YZ plane and movement of the peripheral connector is prevented in the Y-axis or X-axis.

In an embodiment the flex circuit carries electrical signals between a transceiver housing and a peripheral connector. In an embodiment the flex circuit is connected to the transceiver housing and the peripheral connector by a zero insertion force (ZIF) connector. In an embodiment the flex circuit has a planar construction that prevents movement of the flex circuit in the Y-axis. The invention provides for a method of transmitting electrical signals between a transceiver housing and a peripheral connector comprising the steps of providing a flex circuit formed to the foil wrap and a strain relief, the flex circuit having a planer form, mating a first end of the flex circuit to the transceiver using zero insertion force (ZIF) and mating a second end of the flex circuit to the peripheral connector using zero insertion force.

In an embodiment the method further provides the flex circuit including signal lines for transmitting electrical signals between the transceiver housing and the peripheral connector. In an embodiment the method further comprises the steps of flexing the flex circuit in a lateral direction in order to provide access to the peripheral connector when the transceiver housing is mounted to a tightly spaced rack.

In an embodiment the method includes a transceiver housing including at least a pair of peripheral connectors and corresponding flex circuits and a first peripheral connector flexed to a first position and a second peripheral connector flexed in an opposite direction. In an embodiment the method further comprises the steps of providing for lateral movement of the flex circuit or restricting side to side movement and the flex circuit having a center line that defines as Z-axis the flex circuit including an X-axis that is perpendicular to the Z-axis and the Y-axis that is perpendicular to the X-axis, providing for movement of the flex circuit in the YZ-plane and restricting movement of the peripheral connector in a Y-axis and X-axis.

In an embodiment the method further comprises the flex circuit being connected to the transceiver housing and the peripheral connector by zero insertion force (ZIF) connectors. In an embodiment the method further comprising the flex circuit having a planar construction that prevents movement of the flex circuit in the Y-axis plane.

The invention provides a method of controlling deflection of a peripheral connector with respect to a transceiver housing comprising the steps of providing a flex circuit formed of foil wrap and a strain relief, the flex circuit disposed between the peripheral connector and the transceiver housing and restricting deflection of the peripheral connector in a first direction via an anti-deflection member; and controlling the deflection of the peripheral device connector in a second direction opposite the first direction via a deflection control member.

In an embodiment the anti-deflection member may include a flap having a leg for engaging a gap of the peripheral connector in order to prevent deflection of the flex circuit. In an embodiment the method includes the steps of adjusting the length of the leg in order to adjust the deflection angle of the flex circuit with respect to the transceiver housing. In an embodiment the control member may include a détente disposed on the peripheral connector that engages an edge of the transceiver housing in order to control the deflection of the flex circuit.

In an embodiment the steps providing for lateral movement of the flex circuit while restricting side to side movement and the flex circuit having a center line that defines a Z-axis, the flex circuit including an X-axis that is perpendicular to the Z-axis, and a Y-axis that is perpendicular to the X-axis, allowing for deflection of the flex circuit in the YZ-plane and restricting deflection of the peripheral connector in the Y-axis and X-axis.

In an embodiment, the method further comprises the flex circuit connected to the transceiver housing and the peripheral connector by Zero Insertion Force (ZIF) connectors. In an embodiment the flex circuit has a planar construction that restricts movement of the flex circuit in the Y-axis plane. In an embodiment, the further comprising the step of restricting deflection of the flex circuit in the Y-axis plane via a pivot arm attached to a pivot extension disposed adjacent the flex circuit

BRIEF DESCRIPTION OF THE DRAWINGS

FIG. 2 is a side elevation view of the transceiver module of FIG. 1 depicting the peripheral connector extended in a laterally upward direction;

FIG. 3 is a side elevation view of the transceiver module of FIG. 1 depicting the peripheral connector laterally displaced in a downward direction;

FIG. 4 is a plan view of the transceiver module of FIG. 1;

FIG. 5 is an end view of the transceiver module of FIG. 4;

FIG. 6 is a view of the opposite end of the transceiver module and peripheral connector assembly of FIG. 4;

FIG. 7 is a side elevation section view of FIG. 4 taken along a center line;

FIG. 8 is an exploded section view of area A of the flex circuit of FIG. 7;

FIG. 9 is a perspective exploded view of the transceiver module assembly of the present invention;

FIG. 10 is an alternate embodiment depicting multiple transceiver modules of the present invention;

FIG. 11a-c are circuit diagrams of transceiver module assemblies of the present invention;

FIG. 12 is a side elevation of an alternate embodiment of a transceiver module assembly and peripheral connector of the present invention;

FIG. 13 is a side elevation partial cut-away view of the assembly of FIG. 12;

FIG. 14 is a side elevation view of transceiver module of FIG. 12;

FIG. 15 is a side elevation view of the assembly of FIG. 12 depicting the peripheral connector offset at a 45 degree angle;

FIG. 16 is a plan view of an alternate embodiment of a flex circuit assembly; and FIG. 17 is a perspective view of the assembly of FIG. 16.

Figure 1:
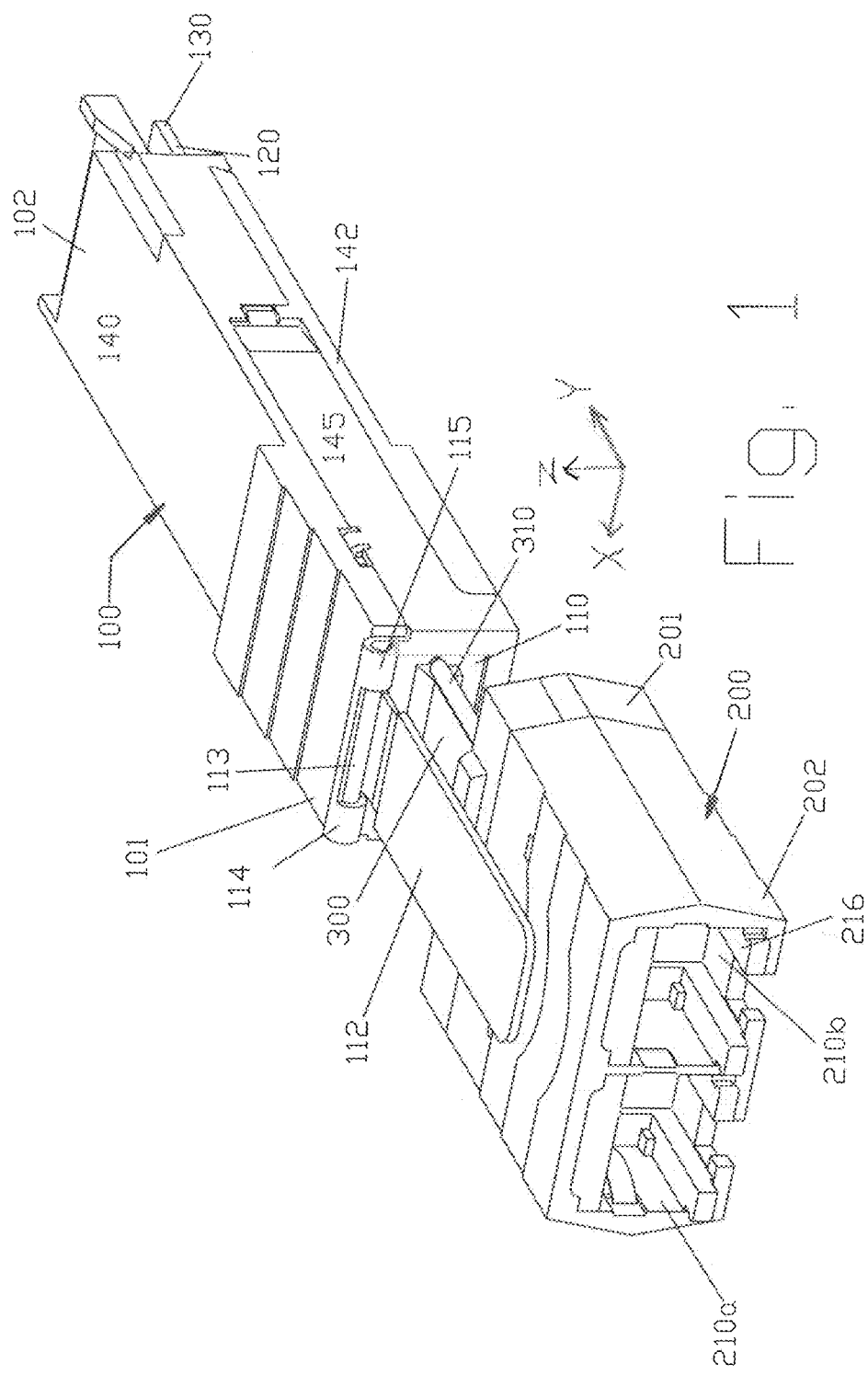
FIG. 1 is a perspective view of the transceiver module assembly and peripheral connector of the present invention.

The figures depict various embodiments of the present invention for purposes of illustration only. One skilled in the art will readily recognize from the following discussion that alternative embodiments of the structures and the methods illustrated herein may be employed without departing from the principles of the invention described herein.

DETAILED DESCRIPTION

FIGS. 1-17 depict embodiments of the present invention. FIG. 1 depicts a transceiver housing 100 having a first end 101 and a second end 102. The first end 101 includes a passage 110. The second end 102 includes a printed circuit board 120 extending from the second end 102 and forming an edge connector 130. A pull tab 112 extends from the first end 101 and is pivotally attached to the transceiver housing 100 via rod 113 that is disposed within a pair of hinge members 114 and 115.

The transceiver housing 100 is comprised of an upper housing 140 and a lower housing 142. A frame member 145 is disposed between the upper housing 140 and lower housing 142. The transceiver module housing, in an embodiment is compliant with the QSFP+ specification SFF-8436, which is incorporated herein by reference. The printed circuit board 120 includes componentry to allow for high speed data transmission which may support links of up to 30 meters using CAT 6A\7 cable. The module may be IEEE 802.3-an compliant. The module may include advance DMI cancellation algorithms, low EMI admissions, 12 C2 wire serial interface for serial ID, MDIO two wire interface for station management and registered support. The transceiver module may include auto-negotiate with other 10G-based-T phy. The transceiver module supports 1G\100 Mbps modes of operation. The module provides automatic detection and correction of writing and polarity swaps. The module may provide multiple loop back modes for testing and troubleshooting. The module may provide built-in cable monitoring and linked diagnostic features including cable length measurements, detached shorts and opens and SNR monitor. The housing in an embodiment may be a die-cast housing. The housing may include a bale latch style ejector mechanism. The module may include unshielded and shielded cable support.

Attached to the transceiver module housing 100 is the peripheral connector 200. The peripheral connector 200 includes a first end 201 and a second end 202. Receptacle openings 210 are provided at the second end 202 of the peripheral connector 200. In an embodiment, the receptacle opening includes a dual port having first opening 210a and second opening 210b. In an embodiment the openings 210a, b provide for an RJ-45 type connection for copper applications. In an alternative embodiment the receptacle opening may provide for fiber optic connectivity such as via an MPO style connector or LC type connectors.

The peripheral connector 200 links via flex circuit 300 to the transceiver module housing 100. The flex circuit 300 may include a flex circuit cover 310 and is received at the first end 101 of the transceiver module housing 100 through passage 110. FIG. 1 depicts the X, Y and Z axis. The Y axis forms a center-line extending laterally through the length of the transceiver housing 100, along the flex circuit 300 and through the peripheral connector 200 (see also FIGS. 2 and 3). The X axis extends perpendicular to the Y axis. The Z axis extends up and down with respect to FIG. 1 and is perpendicular to the Y axis and forms YZ plane. As described below, the flex circuit 300 allows for movement of the peripheral connector in the YZ-plane and movement of the peripheral connector 200 is prevented along the X-axis and Y-axis. The flex circuit 300 may be disposed laterally in the YZ-plane as depicted in FIGS. 2 and 3 and also torsional or rotational twisting of the flex circuit 300 is facilitated in the YZ plane.

Turning to FIG. 2 the transceiver module assembly will be described with respect to the different orientations available for the peripheral connector 200. The transceiver module housing 100 is depicted having a center line Y1 extending from the first end 101 to the second end 102. The flex circuit 300 is shown in a flexed orientation where the peripheral connector 200a has been moved laterally in an upward direction so that the peripheral connector is perpendicular to the center line Y1. The receptacle opening 210 is parallel to the center line Y1. Likewise the pull tab 112 is oriented in a position that is perpendicular to the center line Y1.

Turning to FIG. 3, the peripheral connector 200b is oriented in a downward direction. The connector 200b may be flexed downward in a direction opposite to the position shown for the peripheral connector 200a, shown in FIG. 2. In particular, the peripheral connector 200b has been moved laterally downward, so that it is perpendicular to the center line Y1 of the transceiver module housing of FIG. 3. In such an orientation the receptacle opening 210 of the peripheral connector 200b is parallel to the center line Y1 and connection of a cable may be obtained by inserting the cable in the receptacle opening 210 in a direction perpendicular to the center line Y1. In FIG. 3 the pull tab 112 has not been displaced and is parallel to the center line Y1 in its original orientation. The pull tab need not be reoriented with respect to the lateral orientation of the peripheral connector 200b because it is located along the top portion of the transceiver module housing 100 and does not interfere with the movement of the peripheral connector 200b (which is not the case with respect to FIG. 2 when the peripheral connector 200a is moved upward).

With respect to FIG. 2 and FIG. 3 used in an example where the transceiver module housings are inserted into a server or computer device on a rack (not shown), it can be understood that the lateral movement of the peripheral connectors 200a,b allow for ease of connection of cables in a tightly spaced rack due to the lateral disorientation of the peripheral connections 200a,b.

Turning to FIGS. 4-6 the transceiver module housing 100 is shown where the second end 102 is depicted in FIG. 5 in an end view. Viewing the transceiver module housing 100 from the end, the edge connector 130 is depicted within an opening at the second end 102. FIG. 6 depicts an end view of the second end 202 of the peripheral connector. The receptacle openings 210a,b are shown in FIG. 6 and depict the RJ-45 type connectors having contacts 218 disposed therein. Therefore it is understood that the transceiver module housing may be inserted into a cage of a host device (not shown) and the edge connector 130 received by a connector within the cage of the host. At the opposite end a cable may be inserted in the second end 202 of the peripheral connector 200 in order that signals may be transmitted from the peripheral connector through the flex circuit 300 via the printed circuit board 120 and to the host device via the edge connector 130. And vice versa, signals from the host device can be transmitted backwards out towards the peripheral connector 200 and via cables (not shown) attached to the receptacle openings 210 of the peripheral connector 200.

Turning to FIG. 7 the flex circuit will be described in more detail. The flex circuit 300 is positioned between the transceiver module housing 100 and the peripheral connector 200. In an embodiment the transceiver module 100 includes a zero insertion force (ZIF) connector 156 to receive a conductor extending from the flex circuit 300. Likewise the peripheral connector 200 includes a zero insertion force connector 206 which receives a conductor extending in the opposite direction from the flex circuit 300. FIG. 8 depicts an exploded view of the portion A of the flex circuit 300. The flex circuit includes a lower cover 310 and upper cover 317, a spacer 311, a flex circuit 318 and foil wrap 319 that surrounds the flex circuit in the spacer.

FIG. 7 is a section view of FIG. 4 taken along a center line. The nylon strain relief 317 includes a finger at each end 321, 322 that are received in channels of each of the housings of the transceiver module 100 and peripheral connector 200. The assembly of the transceiver module assembly and the flex circuit may be understood with respect to FIGS. 7 and 8. The flex circuit 300 is assembled having the foil 319 wrapped around the flex circuit 318. Conductors 324, 325 extend at each end of the flex circuit. The lower cover 310 is attached to the bottom of the flex circuit having foil wrap 319. The foil wrap 319 electrically connects the transceiver housing 100 to the peripheral connector 200 in order to providing grounding between the peripheral connector 200 and the transceiver housing 100. The nylon strain relief 317 is then attached to complete the flex circuit assembly 310. The conductor 324 is received in the zero insertion force connector 206 of the peripheral connector 200 by inserting the conductor 324 therein. The finger 321 is received on the housing of the peripheral connector 200. The upper housing 214 is then placed over the finger 321 to secure it within the channel of the upper housing 214. The conductor 325 is then inserted into zero insertion force connector 156 of the transceiver module housing 100. The upper housing 140 is then placed onto the lower housing 142 and the finger 322 is received in the channel of the upper housing 140. Thus by use of the zero insertion force connectors 156, 206 and the nylon strain relief 317 having fingers 321, 322; the quick and easy assembly of the flex circuit 300 between the transceiver module housing 100 and peripheral connector 200 can be accomplished.

Turning to FIG. 9, further details of the invention will be described. The lower body 142 receives a printed circuit board 120 and springs 154 are inserted on the lower body 142 in order to operate the latching mechanism 160. The ZIF connector 156 is then placed adjacent the printed circuit board 120 and the first end 101 of the lower body 142. The frame 145 is mounted between the upper and lower bodies 140, 142, so that the frame 145 may reciprocate laterally (forward and backward) with respect to the lower body 142. The forward movement of the frame member 145 allows the transceiver housing 100 to unlock from a cage/host device (not shown). The upper and lower bodies 140, 142, capture the printed circuit board 120 therebetween. Prior to placement of the upper body 140 onto the lower body housing 142, the flex circuit 300 is assembled.

Assembly of the flex circuit occurs by assembling the cover 310 with the spacer 311, the flex circuit 318 and the foil cover 319. The strain relief 317 is placed on top of the foil wrapped subassembly and the cover 319 is disposed below. The spacer 311 is wrapped by the foil with the flex circuit 318. The finger 322 of the strain relief 317 is received by the upper body 140 of the housing and is clamped in a channel to mount the flex circuit to the housing. As well, the end 325 of the flex circuit 318 is inserted into the ZIF connector 156.

Assembly of the flex circuit is also part of the assembly steps of the peripheral connector 200. The peripheral connector is assembled by placing RJ-45 body 216 into the extension front housing 213. Grounding strips 231, 232 extend into the openings 210a, b of the extension front housing 213. The extension rear bottom housing 215 has an extension printed circuit board 217 placed therein and ZIF connector 206 mounted on top of the extension PCB 217. The extension rear top housing 214 is then placed onto the extension bottom housing 215 to capture the printed circuit board 217 and ZIF connector 216 therein. These assemblies are held together by fasteners 235.

As discussed above with respect to the attachment of the flex connector to the transceiver housing 100, likewise the second end 324 of the flex circuit 318 is received by the ZIF connector 206 of the peripheral connector 200 and the finger 321 of the strain relief 317 is received within a channel of the extension rear top housing 214 to mechanically engage the strain relief 317 therein.

Turning to FIG. 10, four transceiver housings 100a,b,c,d are depicted mounted in close proximity to one another, each of the housings 100a,b,c,d having a peripheral connector 200a,b,c,d (respectively) being attached by flex circuits 300a,b,c,d (respectively). In a situation where the transceiver housings 100a,b,c,d are mounted within a receptacle of a host device and the flex circuits 300a,b,c,d extend through a bezel or opening in the front of the host device, the peripheral connectors 200a,b,c,d can be oriented in varying orientations to allow for easier access to the peripheral connector 200a,b,c,d in tightly spaced racks, so that cables may be plugged to the peripheral connector more easily. The flexible nature of the flex circuits 300a,b,c,d allows for an operator to adjust the orientation of the peripheral connectors 200a,b,c,d in a lateral direction, so that a cable (or pair of cables)(not shown) may be inserted into each peripheral connector 200a,b,c,d.

FIGS. 11a-c are circuit diagrams of an embodiment of the present invention. FIG. 11a depicts the circuitry of a first peripheral connector 200a that provides electrical connections between an RJ-45 connector having eighteen signal lines to connect to the transceiver 100. For example, the circuitry FIG. 11a could be carried by PCB 217 including a PHY Layer IC. FIG. 11b depicts a second peripheral connector 200b having electronic connections to transmit and receive signals between an RJ-45 connector and a transceiver housing 100. It is understood that if there are additional peripheral connectors, such as shown in FIG. 10, each peripheral connector may have circuitry as discussed above. FIG. 11c depicts the electronic circuitry of the transceiver and may be carried by PCB 120. In an embodiment, the transceiver is compliant with the QSFP+ specification and the circuitry in FIG. 11c will comply with SFF 8436 including circuitry to control and FPGA and a SERIAL ID chip. Thirty eight signal pins depicted in FIG. 11c are located to form edge connector 130.

Turning to FIGS. 12-15, an alternate embodiment of the invention will be described. The peripheral connector 400 is pivotally attached to the transceiver housing 410 via pivot extension 412 that is pivotally attached to pivot arm 420, for example by a rivet 429. The pivot extension 412 and pivot arm 420 provide lateral stability to the assembly and prevent the flex circuit 416 from transverse movement in the Y-axis or from twisting about the Y axis (FIG. 2) within the YZ-plane (see FIG. 1). In other words, as shown in FIG. 2 the transceiver housing 200a may be displaced upward (away from the axis Y1), but cannot be displaced to left or right (or into the page or out of the page as depicted in FIG. 2). With respect to FIG. 3, the transceiver housing 200b is displaced downward (away from axis Y1), but cannot be displaced left or rights (or into the page or out of the page as depicted in FIG. 3). A flap 430 is pivotally attached at pivot point 431 to the end of the transceiver housing 410. An anti-deflection member, such as a leg 432 is disposed on the transceiver housing 410. In an embodiment, the flap 430 includes the anti-deflection member and is disposed opposite the pivot point 431 on the flap 430. In an alternate embodiment, the anti-deflection member may be disposed on the peripheral connector 400.

The leg 432 of the flap 430 engages a gap 435 provided by the pivot extension 412 in order to prevent the flex circuit 416 from deflecting upward (in a direction opposite the offset peripheral connector 400, as shown in FIG. 15). The leg 432 may have a predetermined length in order to set the angle of allowed deflection of the connector 400. As shown in FIG. 14, the leg 432 has a length of 0.74 cm and maintains the flex circuit 416 and the connector 400 in-line with the transceiver housing 410. In other words, the leg 432 allows for 0 degree of upward deflection of the flex circuit 416 and connector 400.

In an alternate embodiment, the leg may have half the length of the leg 432 depicted in FIG. 14 (for example a length of 0.37 cm), that will allow twenty eight degrees of upward deflection of the flex circuit 416 and connector 400. So it may be understood that an adjustable anti-deflection member 430/432 is provided by the present invention by altering the length of the leg 432 provided by the flap 430. Any range of deflection between zero to one hundred and twenty degrees may be facilitated by the anti-deflection member 432.

FIG. 15 depicts a deflection control member 441 that controls the angle of deflection of the flex circuit 416 and connector 400 (45 degrees). In an embodiment, the deflection control member 441 includes a triangular shaped detente 441 that engages an edge 443 of the pivot arm 420. In an embodiment the deflection control member is disposed on the peripheral connector 400. In an alternate embodiment, the deflection control member may be disposed on the transceiver housing 410. The invention provides for the détente 441 to engage an edge 443, each provided on either the pivot arm 420 or pivot extension 412 in order to engage one another when the flex circuit 416 is deflected in order to limit the angle of deflection of the peripheral connector 400 with respect to the transceiver housing 410. Any range of deflection between zero to one hundred and twenty degrees may be facilitated by the deflection control member 441

As depicted in FIGS. 16 and 17, the détentes 441a,b are depicted extending from the sides of the pivot extensions 412. In an embodiment, the détente 441 may have a generally triangular shape in cross-section and a hypotenuse 451. The hypotenuse side may have a predetermined angle with respect to the triangular détente 441 in order to control the deflection provided by the flex circuit assembly. For example, as the hypotenuse 451 is formed at steeper angle, it will engage the edge 443a,b of the pivot arm 420 sooner and restrict the deflection of the flex circuit assembly and peripheral connector 400 with respect to the transceiver housing 410. In an embodiment, where the hypotenuse 451 is shallow, the détente 441*a,b* will engage the edge 443*a,b* later and the flex circuit assembly and peripheral connector 400 will be allowed to deflect further with respect to the transceiver housing 410. In an alternate embodiment, the détente 441 may have other rectilinear, triangular or trapezoidal shapes in cross-section and interact with the edge 443 of the pivot arm 420 to control the angle of deflection of the flex circuit assembly. In an embodiment, during manufacture, by positioning the détente distally or proximally along the pivot extension 412, the angle of deflection of the flex circuit may be controlled. It is also understood that the détente 441*a,b* may be located on the pivot arm 420 and engage an edge of the pivot extension 412 and also include all the variations discussed above.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

What is claimed:

1. A transceiver assembly comprising:
    a transceiver housing having a first end having a connector and an opposite second end having a passage in communication with a printed circuit board mounted in the housing,
    a peripheral connector having a first end and an opposite second end, the second end having a receptacle opening,
    a flex circuit disposed between the first end of the peripheral connector and the second end of the transceiver housing, the peripheral connector capable of being displaced with respect to the transceiver housing via the flex circuit;
    the transceiver housing having a center line extending between the first and second end and the flex circuit allowing for displacement of the peripheral connector with respect to the center line;
    the flex circuit allows for lateral movement but prevents side to side movement and the center line defines a Y-axis, the flex circuit including an X-axis that is perpendicular to the Y-axis, and a Z-axis that is perpendicular to the X-axis and forms a YZ plane and the flex circuit allows for movement of the peripheral connector in the YZ-plane and movement of the peripheral connector is prevented along the X-axis and Y-axis; and
    a pivot arm extending from the transceiver housing and a pivot extension protruding from the peripheral connector, the pivot arm and pivot extension being pivotally attached and restricting movement of the flex circuit in the Y-axis.

2. The transceiver assembly of claim 1 wherein the peripheral connector is displaced laterally with respect to the center line upon deflection of the flex circuit and the flex circuit is attached to the transceiver housing in a plane disposed from the center line.

3. The transceiver assembly of claim 1 wherein the flex circuit includes circuit traces for carrying electrical signals between the transceiver housing and the peripheral connector.

4. The transceiver assembly of claim 1 wherein the flex circuit includes a spacer, foil wrap and a strain relief.

5. The transceiver assembly of claim 1 wherein the flex circuit is attached to the transceiver housing by one of a Zero Insertion Force (ZIF) connector, a butt joint and an integral embedded connection of the flex circuit to a rigid board of the transceiver housing.

6. The transceiver of claim 1 wherein a Zero Insertion Force (ZIF) connector is disposed in the peripheral connector and receives an end of the flex circuit.

7. A transceiver assembly comprising:
    a transceiver housing having a first end having a connector and an opposite second end having a passage in communication with a printed circuit board mounted in the housing,
    a peripheral connector having a first end and an opposite second end, the second end having a receptacle opening,
    a flex circuit disposed between the first end of the peripheral connector and the second end of the transceiver housing, the peripheral connector capable of being displaced with respect to the transceiver housing via the flex circuit; and
    an anti-deflection member to limit the angle of deflection of the flex circuit the deflection control member disposed on the pivot arm in order to control the angle of deflection of the flex circuit and peripheral connector.

8. The transceiver assembly of claim 7 wherein the anti-deflection member includes a flap pivotally attached to the transceiver housing.

9. The transceiver assembly of claim 8 wherein the flap having a pivot point on the transceiver housing and a leg opposite the pivot point and the leg received in a gap of the pivot extension.

10. The transceiver assembly of claim 7 wherein the deflection control member includes a détente extending from the pivot arm and engaging an edge of the pivot extension and the cross-sectional shape of the détente controlling the angle deflection of the flex circuit and peripheral connector.

11. A method of controlling deflection of a peripheral connector with respect to a transceiver housing comprising the steps of:
    providing a flex providing a flex circuit formed of foil wrap and a strain relief, the flex circuit disposed between the peripheral connector and the transceiver housing;
    restricting deflection of the peripheral connector in a first direction via an anti-deflection member;
    controlling the deflection of the peripheral device connector in a second direction opposite the first direction via a deflection control member; and
    the anti-deflection member includes a flap having a leg for engaging a gap of the peripheral connector in order to prevent deflection of the flex circuit.

12. The method of claim 11 further comprising the steps of adjusting the length of the leg in order to adjust the deflection angle of the flex circuit with respect to the transceiver housing.

13. A method of controlling deflection of a peripheral connector with respect to a transceiver housing comprising the steps of:
    providing a flex circuit formed of foil wrap and a strain relief, the flex circuit disposed between the peripheral connector and the transceiver housing;
    restricting deflection of the peripheral connector in a first direction via an anti-deflection member;

controlling the deflection of the peripheral device connector in a second direction opposite the first direction via a deflection control member;

wherein the deflection control member includes a notch disposed on the peripheral connector that engages a détente on the transceiver housing in order to control the deflection of the flex circuit.

14. The method of claim 11 further comprising the steps of providing for lateral movement of the flex circuit while restricting side to side movement and the flex circuit having a center line that defines a Y-axis, the flex circuit including an X-axis that is perpendicular to the Y-axis, and a Z-axis is perpendicular to the X-axis and forming a YZ plane;

allowing for deflection of the flex circuit in the YZ plane; and restricting deflection of the peripheral connector in the X-axis and Y-axis.

15. The method of claim 13 wherein the flex circuit is connected to the transceiver housing and the peripheral connector by Zero Insertion Force (ZIF) connectors.

16. The method of claim 14 wherein the flex circuit has a planar construction that restricts movement of the flex circuit in the X-axis and Y-axis.

17. The method of claim 14 further comprising the step of restricting deflection of the flex circuit in the X-axis and Y-axis via a pivot arm attached to a pivot extension disposed adjacent the flex circuit.

* * * * *